(12) United States Patent
Miyamura et al.

(10) Patent No.: US 11,329,415 B2
(45) Date of Patent: May 10, 2022

(54) CONNECTION STRUCTURE FOR CIRCUIT BOARD AND BOARD CONNECTOR, AND BOARD CONNECTOR

(71) Applicants: AutoNetworks Technologies, Ltd., Mie (JP); Sumitomo Wiring Systems, Ltd., Mie (JP); SUMITOMO ELECTRIC INDUSTRIES, LTD., Osaka (JP)

(72) Inventors: Tetsuya Miyamura, Mie (JP); Masaaki Tabata, Mie (JP)

(73) Assignees: Autonetworks Technologies, Ltd., Yokkaichi (JP); Sumitomo Wiring Systems, Ltd., Yokkaichi (JP); Sumitomo Electrics Industries, Ltd., Osaka (JP)

( * ) Notice: Subject to any disclaimer, the term of this patent is extended or adjusted under 35 U.S.C. 154(b) by 238 days.

(21) Appl. No.: 16/628,116

(22) PCT Filed: Jun. 15, 2018

(86) PCT No.: PCT/JP2018/022966
§ 371 (c)(1),
(2) Date: Jan. 2, 2020

(87) PCT Pub. No.: WO2019/009048
PCT Pub. Date: Jan. 10, 2019

(65) Prior Publication Data
US 2021/0367368 A1 Nov. 25, 2021

(30) Foreign Application Priority Data
Jul. 5, 2017 (JP) .............................. JP2017-131868

(51) Int. Cl.
*H01R 13/422* (2006.01)
*H01R 12/71* (2011.01)
(Continued)

(52) U.S. Cl.
CPC ........... *H01R 13/422* (2013.01); *H01R 12/57* (2013.01); *H01R 12/71* (2013.01); *H01R 12/716* (2013.01);
(Continued)

(58) Field of Classification Search
CPC .............. H01R 13/422; H01R 13/6594; H01R 12/716; H01R 13/658; H01R 13/6581; H01R 12/57; H01R 12/71
See application file for complete search history.

(56) References Cited

U.S. PATENT DOCUMENTS

| 6,261,131 B1 | 7/2001 | Kuroda et al. |
| 2012/0149228 A1 | 6/2012 | Matsumoto et al. |
| 2015/0263457 A1* | 9/2015 | Miyoshi ............... H01R 13/506 439/607.27 |

FOREIGN PATENT DOCUMENTS

| JP | 10-308265 | 11/1998 |
| JP | 10308265 A | * 11/1998 |

(Continued)

OTHER PUBLICATIONS

International Search Report dated Sep. 4, 2018.

*Primary Examiner* — Abdullah A Riyami
*Assistant Examiner* — Justin M Kratt
(74) *Attorney, Agent, or Firm* — Gerald E. Hespos; Michael J. Porco; Matthew T. Hespos

(57) ABSTRACT

A shielded board connector (20) includes a terminal holding member for shielding (21) and left and right terminal fittings (31). An unshielded board connector (35) includes a terminal holding member for unshielding (36) and left and right terminal fittings (31). In the pair of terminal fittings (31) in the shielded board connector (20), an interval (Pw) of tab-like connecting portions (32) is wider than an interval (Po) of board connecting portions (34). In the pair of terminal fittings (31) of the unshielded board connector (35), (Continued)

an interval (Pn) of tab-like connecting portions (32) is narrower than an interval (Po) of board connecting portions (34). The interval (Po) of the board connecting portions for shielding (34) and the interval (Po) of the board connecting portions for unshielding (34) are substantially equal.

6 Claims, 16 Drawing Sheets

(51) Int. Cl.
  *H01R 13/6594* (2011.01)
  *H01R 12/57* (2011.01)
  *H01R 13/658* (2011.01)
  *H01R 13/6581* (2011.01)
(52) U.S. Cl.
  CPC ....... *H01R 13/6594* (2013.01); *H01R 13/658* (2013.01); *H01R 13/6581* (2013.01)

(56) References Cited

FOREIGN PATENT DOCUMENTS

| | | |
|---|---|---|
| JP | 2000-252005 | 9/2000 |
| JP | 2007-200576 | 8/2007 |
| JP | 5628653 | 11/2014 |
| JP | 2015-176657 | 10/2015 |

* cited by examiner

CONNECTION STRUCTURE FOR CIRCUIT BOARD AND BOARD CONNECTOR, AND BOARD CONNECTOR

BACKGROUND

Field of the Invention.

The invention relates to a connection structure for circuit board and board connector and also relates to a board connector.

Related Art.

Japanese Unexamined Patent Publication No. 2007-200576 discloses a board connector to be mounted on a circuit board. The board connector includes a terminal holding member to be fixed to the circuit board and terminal fittings mounted through the terminal holding member. Each terminal fitting includes a housing-side connecting portion to be accommodated into a receptacle of the terminal holding member for connection to a wiring harness and a board connecting portion exposed rearward of the terminal holding member for connection to a circuit of the circuit board by welding.

The terminal fittings of the above-described connector are arranged in parallel at predetermined intervals in a lateral direction. Proper parallel intervals of the terminal fittings differ between a shielded board connector in which terminal fittings are surrounded by an outer conductor and an unshielded board connector in which terminal fittings are connected to a twisted pair cable. Thus, intervals of pads of the circuit board to which the board connecting portions are to be connected also differ between a circuit board for shielding and a circuit board for unshielding. Therefore, it has been necessary to prepare two types of circuit boards having different intervals of pads to deal with circuit boards for shielding and circuit boards for unshielding.

The invention was completed on the basis of the above situation and aims to eliminate a need for increasing the number of types of circuit boards.

SUMMARY

A first aspect of the invention is directed to a connection structure for circuit board and to board connector with a circuit board. At least one of a shielded board connector and an unshielded board connector is selectively mountable on the circuit board. The shielded board connector includes a terminal holding member for shielding that is mountable on an upper surface of the circuit board. The shielded board connector further includes left and right terminal fittings for shielding, each of which has a tab-like connecting portion for shielding and a board connecting portion for shielding. The connecting portion for shielding is held through the terminal holding member for shielding, and the board connecting portion for shielding is to be connected to a pad of the circuit board outside the terminal holding member for shielding. The unshielded board connector includes a terminal holding member for unshielding that is mountable on the upper surface of the circuit board. The unshielded board connector further includes left and right terminal fittings for unshielding, each of which has a tab-like connecting portion for unshielding and a board connecting portion for unshielding. The connecting portion for unshielding is held through the terminal holding member for unshielding and the board connecting portion for unshielding is to be connected to the pad of the circuit board outside the terminal holding member for unshielding. An interval of the tab-like connecting portions for shielding is wider than an interval of the board connecting portions for shielding in the terminal fittings for shielding, an interval of the tab-like connecting portions for unshielding is narrower than an interval of the board connecting portions for unshielding in the terminal fittings for unshielding, and the interval of the board connecting portions for shielding and the interval of the board connecting portions for unshielding are substantially equal.

The interval of the tab-like connecting portions for shielding is a distance between centers of the tab-like connecting portions for shielding that are laterally adjacent to each other when the centers of the tab-like connecting portions for shielding in a width direction (lateral direction parallel to an arrangement direction of the tab-like connecting portions for shielding) are defined. The interval of the tab-like connecting portions for unshielding is a distance between centers of the tab-like connecting portions for unshielding that are laterally adjacent to each other when the centers of the respective tab-like connecting portions for unshielding in the width direction (lateral direction parallel to an arrangement direction of the tab-like connecting portions for unshielding) are defined. The interval of the board connecting portions for shielding is a distance between centers of the board connecting portions for shielding that are laterally adjacent to each other when the centers of the respective board connecting portions for shielding in the width direction (lateral direction parallel to an arrangement direction of the board connecting portions for shielding) are defined. The interval of the board connecting portions for unshielding is a distance between centers of the board connecting portions for unshielding that are laterally adjacent to each other when the centers of the respective board connecting portions for unshielding in the width direction (lateral direction parallel to an arrangement direction of the board connecting portions for unshielding) are defined.

If Pw denotes the interval of the tab-like connecting portions for shielding, Pn denotes the interval of the tab-like connecting portions for unshielding and Po denotes the interval of the board connecting portions for shielding and the interval of the board connecting portions for unshielding, $Po=Pw/2+Pn/2$. According to this configuration, a dimensional difference of the interval Pw of the tab-like connecting portions for shielding and the interval Po of the board connecting portions for shielding and a dimensional difference of the interval Pn of the tab-like connecting portions for unshielding and the interval Po of the board connecting portions for unshielding are equal. Therefore, the terminal fittings for shielding and the terminal fittings for unshielding can be used commonly used.

The terminal fitting for shielding may include a leg for shielding that links a rear end of the tab-like connecting portion for shielding and the board connecting portion for shielding. The leg for shielding is disposed laterally concentrically with respect to the tab-like connecting portion for shielding. According to this configuration, a high communication performance due to an interval of the left and right terminal fittings for shielding is maintained up to the vicinity of the circuit board.

The terminal fitting for unshielding may include a leg for unshielding that links a rear end of the tab-like connecting portion for unshielding and the board connecting portion for unshielding. The leg for unshielding may be disposed laterally concentrically with respect to the tab-like connecting portion for unshielding. According to this configuration, a high communication performance due to an interval of the left and right terminal fittings for unshielding is maintained up to the vicinity of the circuit board.

A second aspect of the invention is directed to a board connector with a terminal holding member mountable on an upper surface of a circuit board, and left and right terminal fittings each including a tab-like connecting portion held through the terminal holding member and a board connecting portion to be connected to a pad of the circuit board outside the terminal holding member. An interval of the tab-like connecting portions is different from an interval of the board connecting portions in the terminal fittings.

The second aspect of the invention may be such that the terminal fitting includes a leg that links a rear end of the tab-like connecting portion and the board connecting portion. The leg may be disposed laterally concentrically with respect to the tab-like connecting portion. According to this configuration, a high communication performance due to an interval of the left and right terminal fittings is maintained up to the vicinity of the circuit board.

The interval of the board connecting portions for shielding and the interval of the board connecting portions for unshielding are substantially equal according to the first aspect of the invention. Thus, an interval of the pads of the circuit board for shielding and an interval of the pads of the circuit board for unshielding can be set equal. In this way, the circuit board can be used commonly for both the shielded board connector and the unshielded board connector.

According to the second aspect of the invention, in the shielded board connector, the terminal fittings are mounted in the terminal holding member so that the interval of the tab-like connecting portions is larger than the interval of the board connecting portions. In the unshielded board connector, the terminal fittings are mounted in the terminal holding member so that the interval of the tab-like connecting portions is smaller than the interval of the board connecting portions. If the interval of the board connecting portions for shielding and the interval of the board connecting portions for unshielding are set substantially equal, the circuit board can be used commonly for the shielded board connector and the unshielded board connector.

DETAILED DESCRIPTION

First Embodiment

Figure 1:
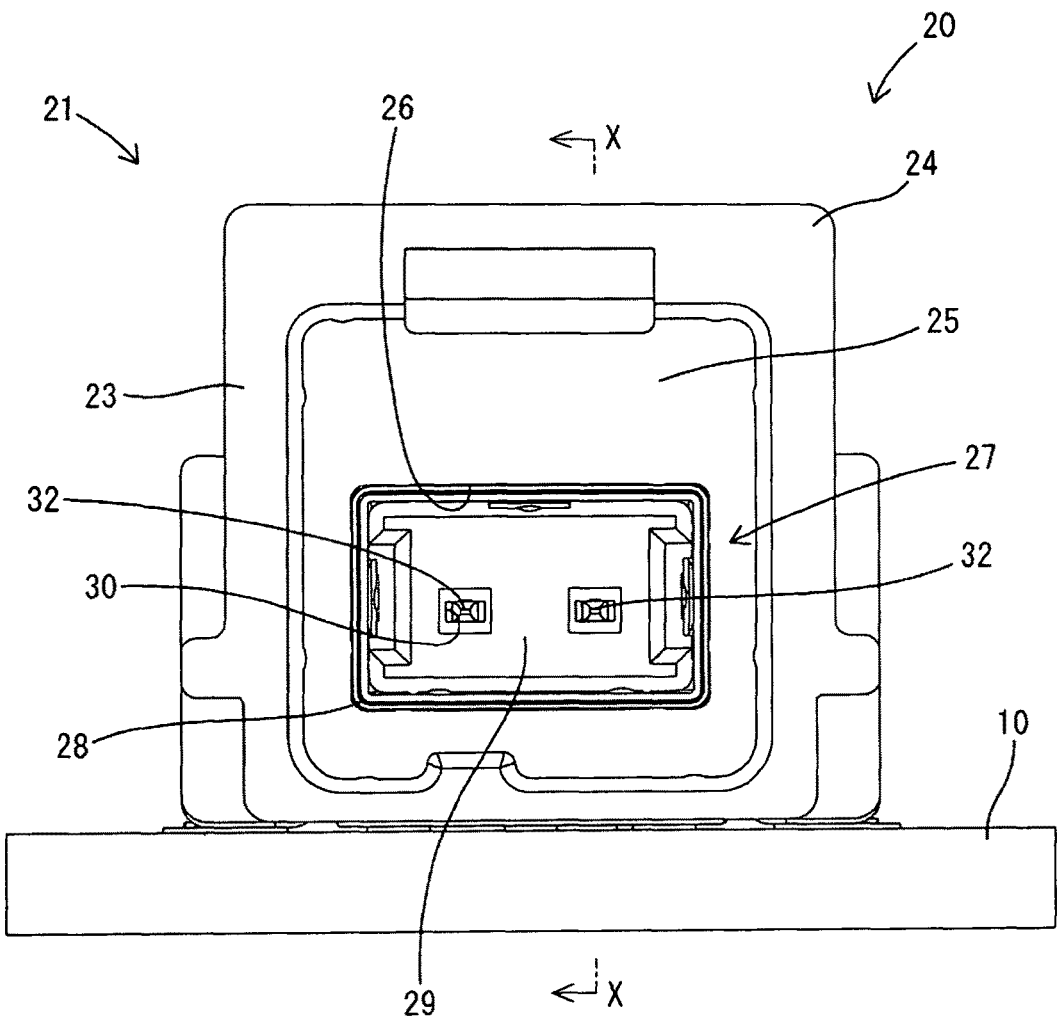
FIG. 1 is a front view showing a state where a shielded board connector is mounted on a circuit board in a first embodiment.

Hereinafter, a first embodiment of the invention is described with reference to FIGS. 1 to 8. Note that, in the following description, an upper side in FIGS. 3 and 7 and a left side in FIGS. 4 and 8 are defined as a front side concerning a front-rear direction. Upper and lower sides shown in FIGS. 1, 2, 4, 5, 6 and 8 are defined as upper and lower sides concerning a vertical direction. Left and right sides shown in FIGS. 2, 3, 6 and 7 are defined as left and right sides concerning a lateral direction A connection structure of the first embodiment is used for an Ethernet (registered trademark) high-speed communication circuit. This connection structure includes a circuit board 10 common for shielding and for unshielding, a shielded board connector 20 (board connector as claimed) and an unshielded board connector 35 (board connector as claimed). Only either one of the shielded board connector 20 and the unshielded board connector 35 is mounted on the circuit board 10.

<Circuit Board 10>

The circuit board 10 is disposed in a horizontal orientation, and a conductor pattern (not shown) is formed on the upper surface of the circuit board 10 by printing. As shown in FIG. 3, two bilaterally symmetrical pads 11 constituting the conductor pattern are disposed in an area behind the front edge of the circuit board 10. Each pad 11 has a substantially rectangular shape elongated in the front-rear direction in a plan view. The pads 11 are arranged laterally side by side at a predetermined interval Po. Note that the interval Po is a distance between centers of the pads 11 laterally adjacent to each other when the centers of the pads 11 in a width direction (lateral direction parallel to an arrangement direction of the pair of pads 11) are defined.

An area of the upper surface of the circuit board 10 in front of the pads 11 serves as a fixing space for arranging the shielded board connector 20 or unshielded board connector 35. The conductor pattern of the circuit board 10 and an electronic component (not shown) to be mounted on the circuit board 10 are common between the shielded board connector 20 and the unshielded board connector 35. The circuit board 10 is accommodated in an electromagnetically shielded casing (not shown).

<Shielded Board Connector 20>

As shown in FIGS. 1 to 4, the shielded board connector 20 includes a terminal holding member for shielding 21 and two bilaterally symmetrically terminal fittings 31 (terminal fittings for shielding and terminal fittings for unshielding as claimed). The terminal holding member for shielding 21 functionally includes a terminal penetrating wall for shielding 22 substantially perpendicular to the upper surface of the circuit board 10 and a receptacle for shielding 23 in the form of a rectangular tube extending forward from the outer peripheral edge of the terminal penetrating wall for shielding 22. The terminal holding member for shielding 21 is configured by assembling an insulation housing 24 made of synthetic resin, an outer conductor 28 and a dielectric 29 in terms of component configuration.

The insulation housing 24 is a single component including a wall-like body for shielding 25 constituting the terminal penetrating wall for shielding 22 and the receptacle for shielding 23 projecting forward from the outer peripheral edge of the body for shielding 25. The body for shielding 25 is formed with a mounting hole 26 penetrating in the front-rear direction. A shield terminal 27 is mounted to penetrate through the mounting hole 26.

The shield terminal 27 is configured by assembling the outer conductor 28 in the form of a rectangular tube bent into a substantially L shape in a side view, the dielectric 29 accommodated in a rear end part of the outer conductor 28 and the left and right terminal fittings 31. The dielectric 29 is formed with left and right press-fit holes for shielding 30 penetrating in the front-rear direction, and the terminal fittings 31 individually are passed through the dielectric 29 while being press-fit into the respective press-fit holes for shielding 30.

A rear end part of the outer conductor 28 of the shield terminal 27 is fit into the mounting hole 26. A front area of the outer conductor 28 of the shield terminal 27 and front areas of the terminal fittings 31 (front end side areas of the tab-like connecting portions 32) project forward from the body for shielding 25 and are accommodated in the receptacle for shielding 23. The terminal penetrating portion for shielding 22 includes the body for shielding 25 and the dielectric 29. The two terminal fittings 31 are held in the terminal holding member for shielding 21 while penetrating through the terminal holding member for shielding 21.

Figure 2:
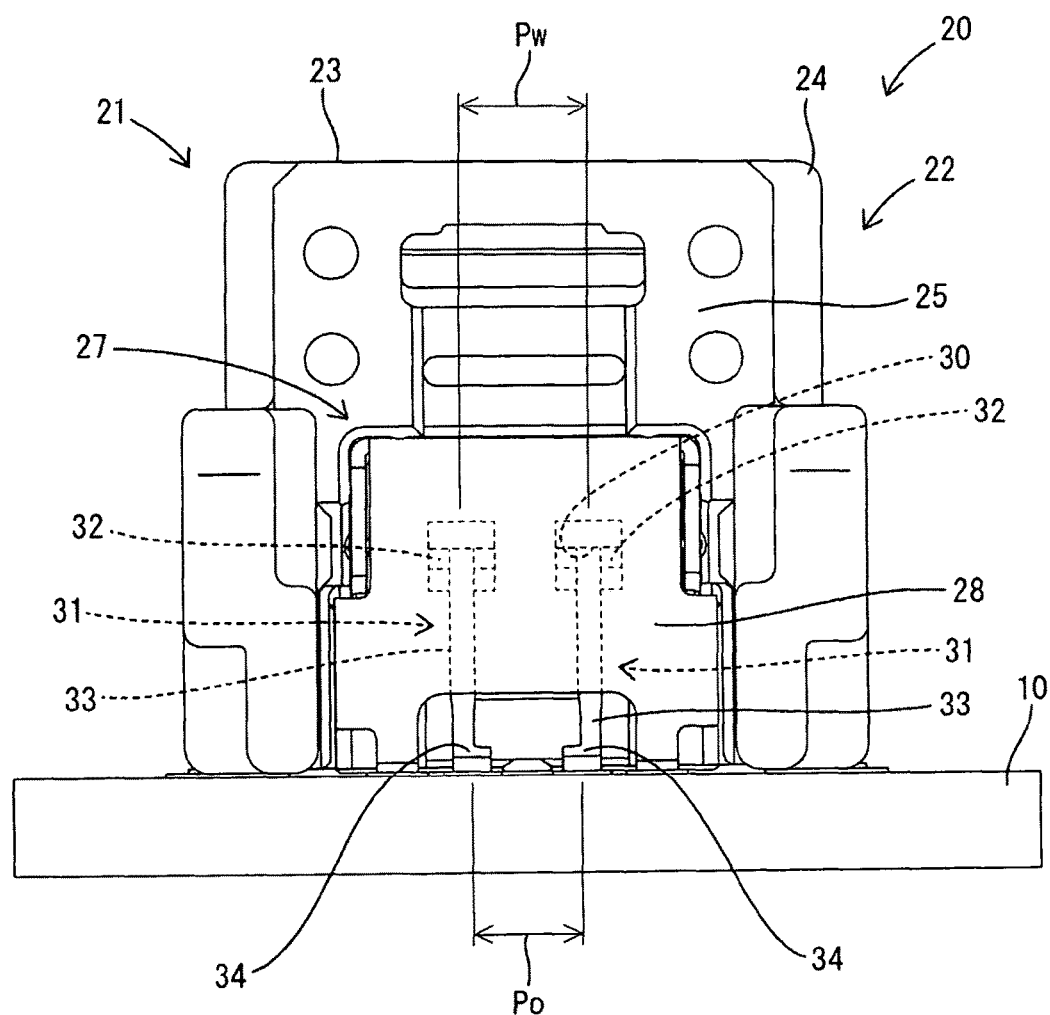
FIG. 2 is a back view showing the state where the shielded board connector is mounted on the circuit board.
Figure 3:
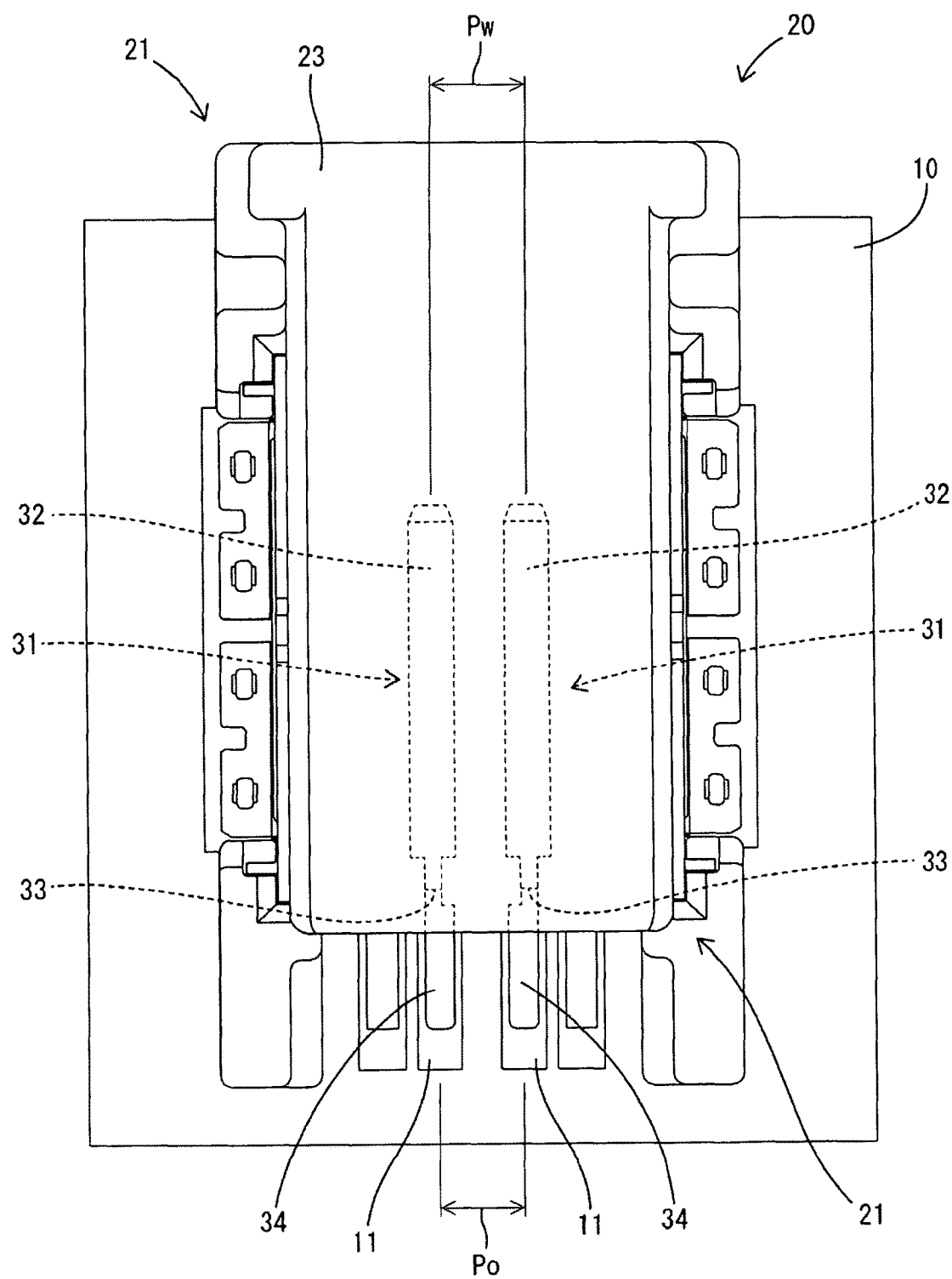
FIG. 3 is a plan view showing the state where the shielded board connector is mounted on the circuit board.
Figure 4:
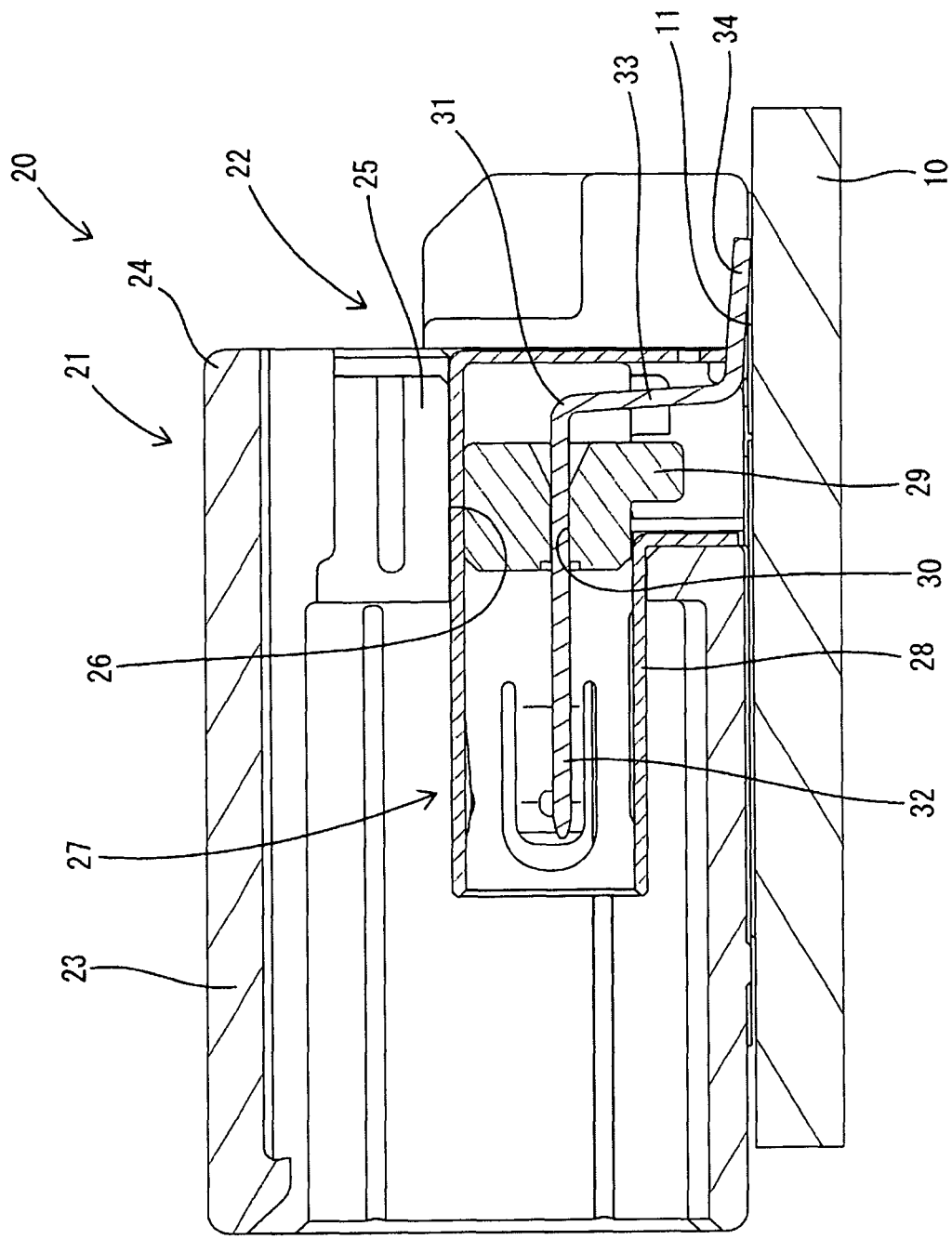
FIG. 4 is a section along X-X of FIG. 1.
Figure 5:
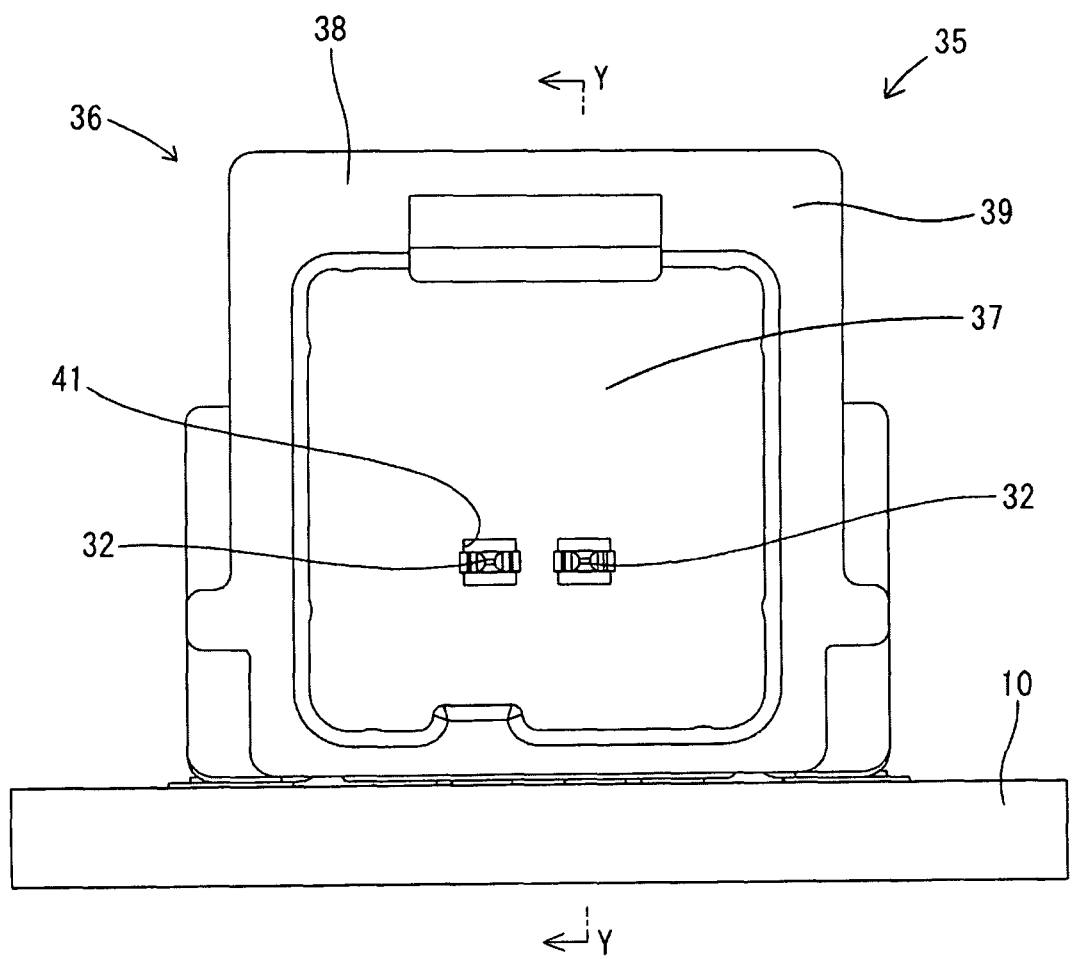
FIG. 5 is a front view showing a state where an unshielded board connector is mounted on the circuit board.

As shown in FIGS. 2 and 3, the two terminal fittings 31 are bilaterally symmetrical. Each terminal fitting 31 is formed into a predetermined shape by bending one elongated metal material. As shown in FIG. 4, each terminal fitting 31 includes the tab-like connecting portion 32 (tab-like connecting portion for shielding and tab-like connecting portion for unshielding as claimed), a leg 33 (leg portion for shielding and leg portion for unshielding as claimed) and a board connecting portion 34 (board connecting portion for shielding and board connecting portion for unshielding as claimed).

The tab-like connecting portion 32 extends straight in the front-rear direction (direction parallel to the upper surface of the circuit board 10), and penetrates through the press-fit hole for shielding 30 of the terminal penetrating portion for shielding 22 in the front-rear direction. The front area of the tab-like connecting portion 32 projects forward of the terminal penetrating portion for shielding 22 and is accommodated in the receptacle for shielding 23. A rear part of the tab-like connecting portion 32 projects rearward of the dielectric 29 constituting the terminal penetrating portion for shielding 22 and is covered by a rear part of the outer conductor 28.

The leg 33 extends straight down toward the circuit board 10 substantially at a right angle from the rear end of the tab-like connecting portion 32 and is covered by the rear end part of the outer conductor 28. The board connecting portion 34 extends straight from the lower end of the leg 33 to be substantially parallel to the upper surface of the circuit board 10. The board connecting portion 34 is narrower than the pad 11. As shown in FIG. 3, in a plan view, the board connecting portions 34 are disposed to overlap the pads 11 and each board connecting portion 34 is disposed at a center position of the pad 11 in the lateral direction. The board connecting portion 34 is fixed conductively to the upper surface of the pad 11 by reflow soldering.

The terminal fittings 31 are arranged bilaterally symmetrically while being mounted in the terminal holding member for shielding 21. In the terminal fittings 31 mounted in the terminal holding member for shielding 21, an interval Pw in the lateral direction between the tab-like connecting portions 32 is larger than an interval Po in the lateral direction between the board connecting portions 34. Note that the interval Pw is a distance between centers of the tab-like connecting portions 32 that are laterally adjacent to each other when the centers of the respective tab-like connecting portions 32 in the width direction (lateral direction parallel to an arrangement direction of the tab-like connecting portions 32) are defined. Further, the internal Po is a distance between centers of the board connecting portions 34 that are laterally adjacent to each other when the centers of the respective board connecting portions 34 in the width direction (lateral direction parallel to an arrangement direction of the pair of board connecting portions 34) are defined.

As shown in FIGS. 2 and 3, in a plan view and a back view, the tab-like connecting portion 32 and the leg 33 are in such a concentric positional relationship that centers in the width direction (lateral direction) coincide. The widthwise center of the board connecting portion 34 is at a position decentered offset either left or right with respect to the tab-like connecting portion 32 and the leg 33. Specifically, the tab-like connecting portion 32 and the leg 33 are offset left with respect to the board connecting portion 34 in the terminal fitting 31 located on a left side, and the tab-like connecting portion 32 and the leg 33 are offset right with respect to the board connecting portion 34 in the terminal fitting 31 located on a right side.

A shielded connector (not shown) mounted on an end part of a shielded harness (not shown) is connected to the shielded board connector 20. The shielded harness is formed such that two unshielded wires are surrounded by a tubular shield, such as a braided wire, and female terminal fittings are fixed to the respective unshielded wires. Two of the female terminal fittings are accommodated into the shielded connector and surrounded by a shield shell constituting the shielded connector. The shielded connector is fit into the receptacle for shielding 23 of the shielded board connector 20, and the female terminal fittings are connected individually to the pair of tab-like connecting portions 32, and the shield shell is connected to the outer conductor 28.

As described above, the interval Pw between the left and right tab-like connecting portions 32 is wider than the interval Po of the board connecting portions 34. This is because the interval between the left and right tab-like connecting portions 32 is adjusted to a distance between the tab-like connecting portions 32 and the outer conductor 28 in the shield terminal 27. The distance between the tab-like connecting portions 32 and the outer conductor 28 is roughly equal to a distance between the female terminal fittings and the shield shell in the shielded connector. The distance between the tab-like connecting portions 32 and the outer conductor 28 is set optimally in view of a shielding function.

<Unshielded Board Connector 35>

As shown in FIGS. 5 to 8, the unshielded board connector 35 includes a terminal holding member for unshielding 36 and two bilaterally symmetrically terminal fittings 31. The terminal fittings 31 are in an arrangement laterally opposite to the arrangement of the terminal fittings 31 constituting the shielded board connector 20. The terminal holding member for unshielding 36 is shaped to include a terminal penetrating wall for unshielding 37 substantially perpendicular to the upper surface of the circuit board 10 and a receptacle for unshielding 38 in the form of a rectangular tube extending forward from the outer peripheral edge of the terminal penetrating wall for unshielding 37. The terminal holding member for unshielding 36 is composed of a connector housing 39 made of synthetic resin.

The connector housing 39 is a single component including a wall-like body for unshielding 40 constituting the terminal penetrating portion for unshielding 37 and the receptacle for unshielding 38 projecting forward from the outer peripheral edge of the body for unshielding 40. The body for unshielding 40 is formed with left and right press-fit holes for unshielding 41 penetrating in the front-rear direction. The terminal fittings 31 individually are passed through and held in the terminal holding member for unshielding 36 while being press-fit into the respective press-fit holes for unshielding 41.

Figure 6:
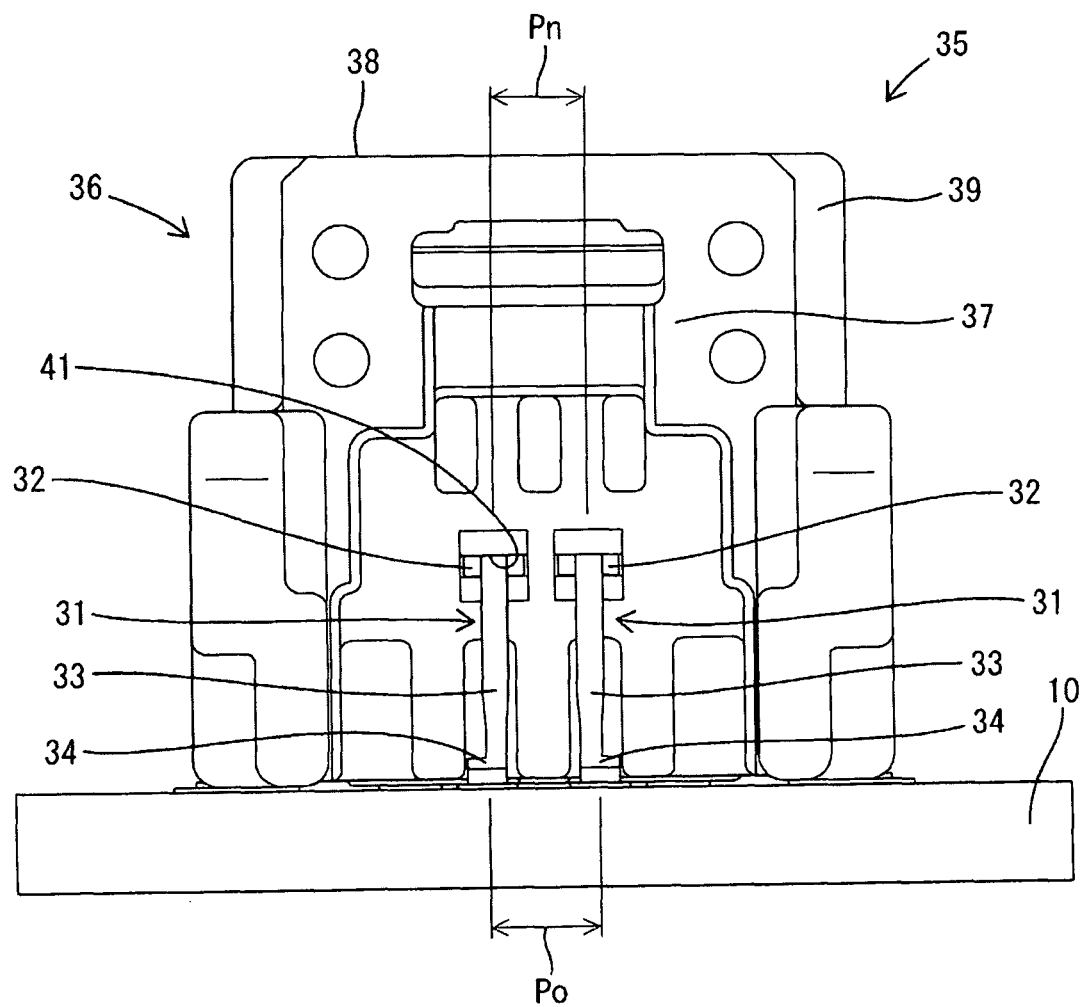
FIG. 6 is a back view showing the state where the unshielded board connector is mounted on the circuit board.
Figure 7:
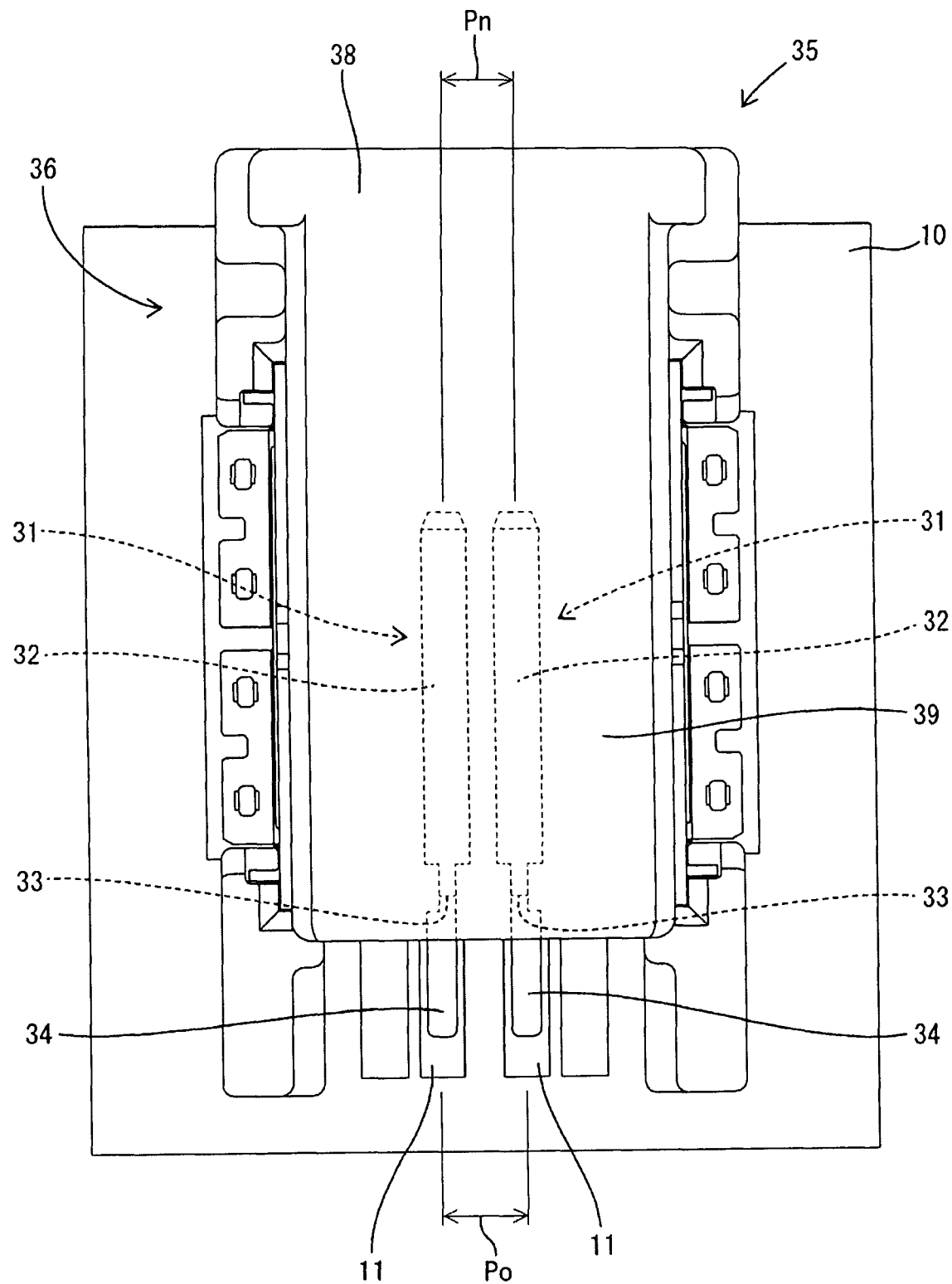
FIG. 7 is a plan view showing the state where the unshielded board connector is mounted on the circuit board.
Figure 8:
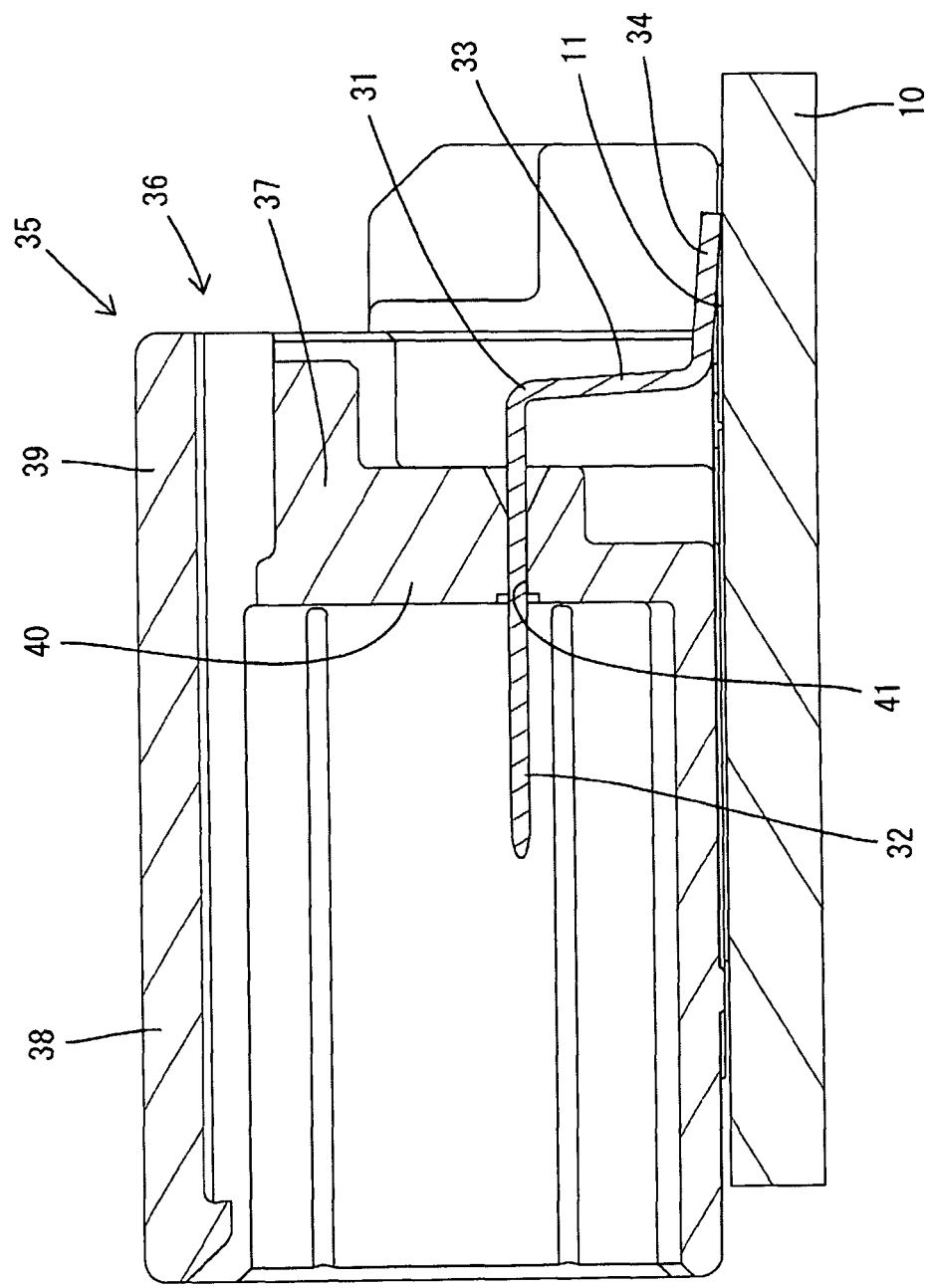
FIG. 8 is a section along Y-Y of FIG. 5.

As shown in FIGS. 6 and 7, the terminal fittings 31 in the unshielded board connector 35 also are bilaterally symmetrical shape as in the shielded board connector 20. A tab-like connecting portion 32 extends straight in the front-rear direction (direction parallel to the upper surface of the circuit board 10), and penetrates through the press-fit hole for unshielding 41 of the terminal penetrating portion for unshielding 37 in the front-rear direction. A front area of the tab-like connecting portion 32 projects forward of the terminal penetrating portion for unshielding 37 and is accommodated in the receptacle for unshielding 38. A rear part of the tab-like connecting portion 32 projects rearward of the terminal penetrating portion for unshielding 37.

A leg 33 extends straight down toward the circuit board 10 substantially at a right angle from the rear end of the tab-like connecting portion 32. A board connecting portion 34 extends straight from the lower end of the leg 33 to be substantially parallel to the upper surface of the circuit board 10. As shown in FIG. 7, two the board connecting portions 34 are disposed to overlap the two pads 11 in a plan view and each board connecting portion 34 is disposed at a center position of the pad 11 in the lateral direction. The board connecting portion 34 is conductively fixed to the upper surface of the pad 11 by reflow soldering.

The terminal fittings 31 are arranged bilaterally symmetrically while being mounted in the terminal holding member for unshielding 36. When the pair of terminal fittings 31 are mounted in the terminal holding member for unshielding 36, an interval Pn in the lateral direction between the tab-like connecting portions 32 is larger than an interval Po in the lateral direction between the board connecting portions 34. Note that the interval Pn is a distance between centers of the tab-like connecting portions 32 that are laterally adjacent to each other when the centers of the respective tab-like connecting portions 32 in the width direction (lateral direction parallel to an arrangement direction of the tab-like connecting portions 32) are defined. Thus, in the unshielded board connector 35, the tab-like connecting portion 32 and the leg 33 are offset right with respect to the board connecting portion 34 in the terminal fitting 31 located on a left side and the tab-like connecting portion 32 and the leg 33 are offset left with respect to the board connecting portion 34 in the terminal fitting 31 located on a right side, contrary to the shielded board connector 20.

The interval Po in the lateral direction between the board connecting portions 34 in the unshielded board connector 35 is equal to the interval Po in the lateral direction between the board connecting portions 34 in the shielded board connector 20. Thus, the interval Pn between the tab-like connecting portions 32 in the unshielded board connector 35 is narrower than the interval Pw between the tab-like connecting portions 32 in the shielded board connector 20. The interval Po of the board connecting portions 34, the interval Pw of the tab-like connecting portions 32 in the shielded board connector 20 and the interval Pn of the tab-like connecting portions 32 in the unshielded board connector 35 satisfy a dimensional relationship of $Po = Pw/2 + Pn/2$.

Due to this dimensional relationship, the two terminal fittings 31 can be used commonly in both the shielded board connector 20 and the unshielded board connector 35 and, simultaneously, a positional relationship of the pads 11 of the circuit board 10 can be common to the shielded board connector 20 and the unshielded board connector 35. In this way, both the shielded board connector 20 and the unshielded board connector 35 can be dealt with only by two types of the terminal fittings 31 and one type of the circuit board 10.

An unshielded connector (not shown) mounted on an end part of a twisted pair cable (not shown) is connected to the unshielded board connector 35. The twisted pair cable is formed such that two unshielded wires are twisted spirally at predetermined intervals into one cable, and female terminal fittings are fixed to the respective unshielded wires. Two of the female terminal fittings are accommodated into the unshielded connector. If the unshielded connector is fit into the receptacle for unshielding 38 of the unshielded board connector 35, the female terminal fittings are connected individually to the tab-like connecting portions 32.

Functions and Effects of First Embodiment

The connection structure of the first embodiment includes the circuit board 10, the shielded board connector 20 and the unshielded board connector 35, and either one of the shielded board connector 20 and the unshielded board connector 35 selected according to application is mounted on the circuit board 10.

The shielded board connector 20 includes the terminal holding member for shielding 21 mountable on the upper surface of the circuit board 10 and the left and right terminal fittings 31 for shielding held in the terminal holding member for shielding 21. Each of the terminal fittings 31 includes the tab-like connecting portion 32 for shielding held through the terminal holding member for shielding 21 and the board connecting portion 34 for shielding to be connected to the pad 11 of the circuit board 10 outside the terminal holding member for shielding 21.

The unshielded board connector 35 includes the terminal holding member for unshielding 36 mountable on the upper surface of the circuit board 10 and the left and right terminal fittings 31 for unshielding held in the terminal holding member for unshielding 36. The terminal fittings 31 are the same components as the terminal fittings 31 for shielding and each includes the tab-like connecting portion 32 for unshielding held through the terminal holding member for unshielding 36 and the board connecting portion 34 for unshielding to be connected to the pad 11 of the circuit board 10 outside the terminal holding member for unshielding 36.

The interval of the tab-like connecting portions 32 is wider than the interval of the board connecting portions 34 in the terminal fittings 31 mounted in the shielded board connector 20, whereas the interval of the tab-like connecting portions 32 is narrower than the interval of the board connecting portions 34 for unshielding in the of terminal fittings 31 mounted in the unshielded board connector 35. On the other hand, the interval of the board connecting portions 34 in the shielded board connector 20 is substantially equal to the interval of the board connecting portions 34 in the unshielded board connector 35.

According to this configuration, since the interval of the board connecting portions 34 in the shielded board connector 20 and the interval of the board connecting portions 34 in the unshielded board connector 35 are substantially equal, the interval of the pads 11 of the circuit board 10 for shielding and the interval of the pads 11 of the circuit board 10 for unshielding can be set equal. In this way, it could be realized to use commonly the circuit board 10 for shielding and the circuit board 10 for unshielding.

Further, if Pw denotes the interval of the tab-like connecting portions 32 in the shielded board connector 20, Pn denotes the interval of the tab-like connecting portions 32 in the unshielded board connector 35 and Po denotes the interval of the board connecting portions 34 in the shielded board connector 20 and the interval of the board connecting portions 34 in the unshielded board connector 35, Po=Pw/2+Pn/2. According to this configuration, a dimensional difference between the interval Pw of the tab-like connecting portions 32 and the interval Po of the board connecting portions 34 in the shielded board connector 20 and a dimensional difference between the interval Pn of the tab-like connecting portions 32 and the interval Po of the board connecting portions 34 in the unshielded board connector 35 are equal. Thus, the terminal fittings 31 can be used commonly in the shielded board connector 20 and the unshielded board connector 35.

Further, the terminal fitting 31 of the shielded board connector 20 includes the leg 33 linking the rear end of the tab-like connecting portion 32 and the board connecting portion 34 and the leg 33 is disposed laterally concentrically with respect to the tab-like connecting portion 32. According to this configuration, a high communication performance realized by properly setting the interval of the left and right terminal fittings 31 is maintained up to the vicinity of the circuit board 10. Similarly, also in the unshielded board connector 35, the terminal fitting 31 includes the leg 33 linking the rear end of the tab-like connecting portion 32 and the board connecting portion 34 and the leg 33 is disposed laterally concentrically with respect to the tab-like connecting portion 32. Thus, also in the unshielded board connector 35, a high communication performance due to the interval of the left and right terminal fittings 31 is maintained up to the vicinity of the circuit board 10.

Second Embodiment

A second embodiment of the invention is described with reference to FIGS. 9 to 12. A connection structure of the second embodiment differs from that of the first embodiment in the configuration of bilaterally symmetrical terminal fittings 43 mounted in a shielded board connector 42 and an unshielded board connector 47. The other components are the same as in the first embodiment. These same components are denoted by the same reference signs and the structures, functions and effects thereof are not described.

Figure 9:
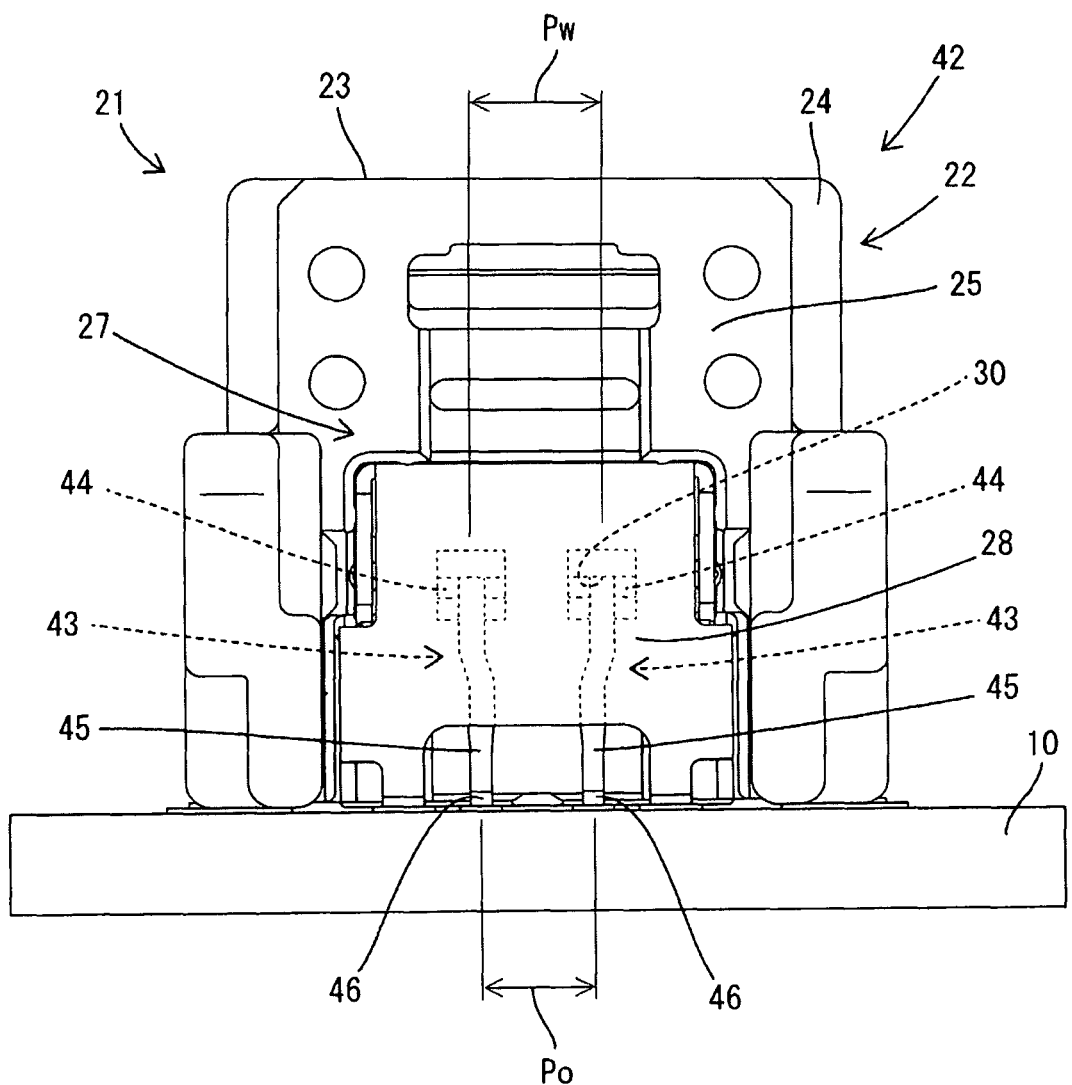
FIG. 9 is a back view showing a state where a shielded board connector is mounted on a circuit board in a second embodiment.
Figure 10:
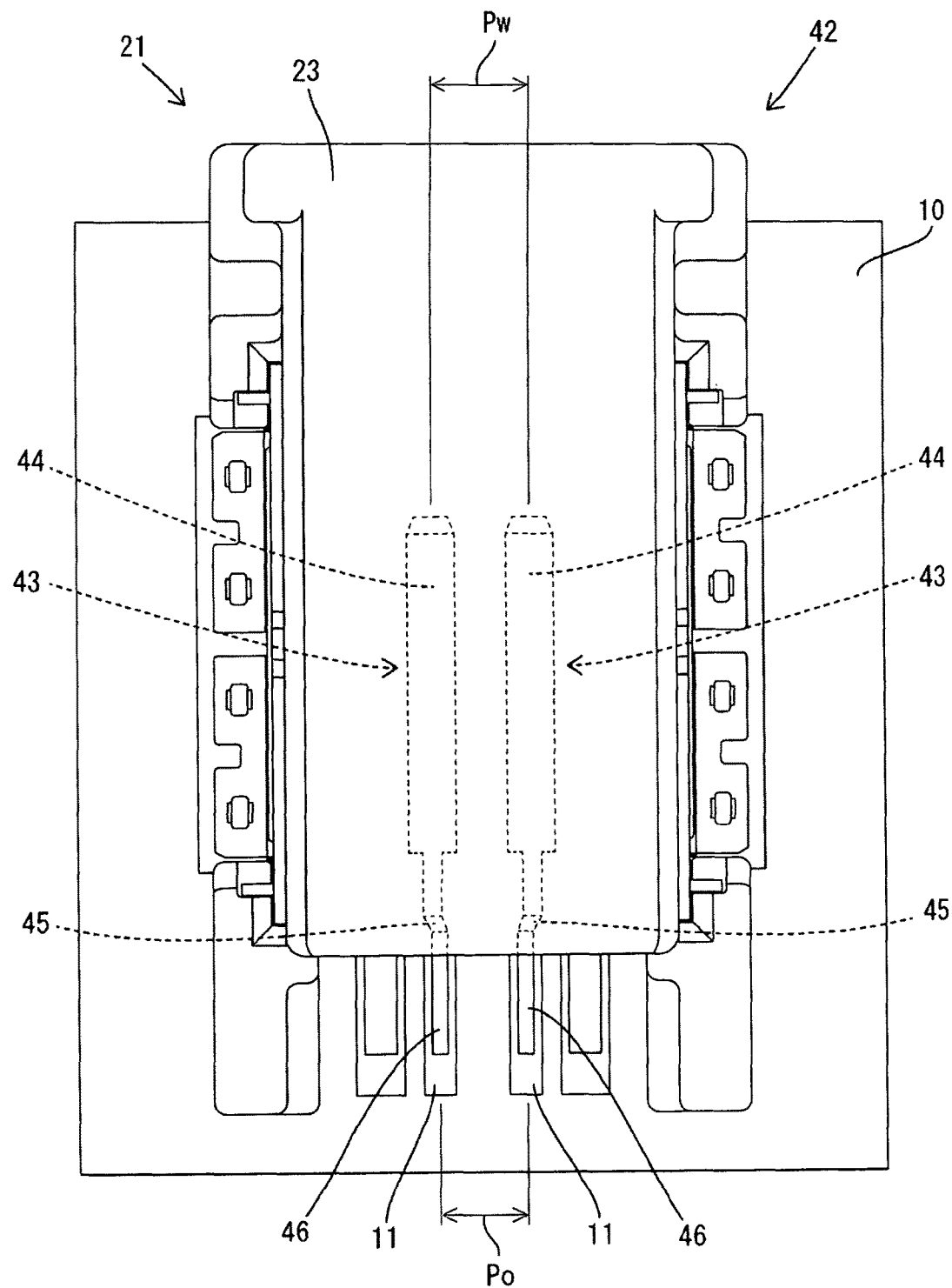
FIG. 10 is a plan view showing the state where the shielded board connector is mounted on the circuit board.

The left and right terminal fittings 43 (terminal fittings for shielding and terminal fittings for unshielding as claimed) of the shielded board connector 42 are held in a terminal holding member for shielding 21 while penetrating through a terminal penetrating wall for shielding 22. As shown in FIGS. 9 and 10, the terminal fittings 43 are bilaterally symmetrical. Each terminal fitting 43 is formed into a predetermined shape by bending one elongated metal material. Each terminal fitting 43 includes a tab-like connecting portion 44 (tab-like connecting portion for shielding and tab-like connecting portion for unshielding as claimed), a leg 45 (leg portion for shielding and leg portion for unshielding as claimed) and a board connecting portion 46 (board connecting portion for shielding and board connecting portion for unshielding as claimed).

The tab-like connecting portion 44 extends straight in a front-rear direction (direction parallel to the upper surface of a circuit board 10), and penetrates through a press-fit hole for shielding 30 of the terminal penetrating wall for shielding 22 in the front-rear direction. A front area of the tab-like connecting portion 44 projects forward of the terminal penetrating wall for shielding 22 and is accommodated in a receptacle for shielding 23. A rear part of the tab-like connecting portion 44 projects rearward of a dielectric (not shown) constituting the terminal penetrating wall for shielding 22 and is covered by a rear end part of an outer conductor 28.

The leg 45 extends straight down toward the circuit board 10 substantially at a right angle from the rear end of the tab-like connecting portion 44 and is covered by the rear part of the outer conductor. A back view shape of the leg 45 is bent so that a substantially vertically extending upper area and a substantially vertically extending lower area are laterally shifted. The board connecting portion 46 extends straight from the lower end of the leg 45 to be substantially parallel to the upper surface of the circuit board 10. A width (lateral dimension) of the board connecting portion 46 is smaller than that of a pad 11. As shown in FIG. 10, in a plan view, two of the board connecting portions 46 are disposed to overlap two of the pads 11 and each board connecting portion 46 is disposed at a center position of the pad 11 in a lateral direction. The board connecting portion 46 is fixed conductively to the upper surface of the pad 11 by reflow soldering.

In the two terminal fittings 43, an interval Pw in the lateral direction between the tab-like connecting portions 44 is larger than an interval Po in the lateral direction between the board connecting portions 46. Note that the interval Pw is a distance between centers of the two tab-like connecting portions 44 laterally adjacent to each other when the centers of the respective tab-like connecting portions 44 in a width direction (lateral direction parallel to an arrangement direction of the tab-like connecting portions 44) are defined. Further, the interval Po is a distance between centers of the two board connecting portions 46 laterally adjacent to each other when the centers of the respective board connecting portions 46 in the width direction (lateral direction parallel to an arrangement direction of the board connecting portions 46) are defined.

As shown in FIGS. 9 and 10, in a plan view and a back view, the tab-like connecting portion 44 and the upper area of the leg 45 are in such a concentric positional relationship that centers in the width direction (lateral direction) coincide. The lower end side area of the leg 45 and the board connecting portion 46 are also in such a concentric positional relationship that centers in the width direction (lateral direction) coincide. The upper area and the lower area of the leg 45 are at positions offset either left or right. In the terminal fitting 43 located on a left side, the tab-like connecting portion 44 and the upper end side area of the leg 45 are offset left with respect to the lower area of the leg 45 and the board connecting portion 46. In the terminal fitting 43 located on a right side, the tab-like connecting portion 44 and the upper area of the leg 45 are offset right with respect to the lower area of the leg 45 and the board connecting portion 46.

Figure 11:
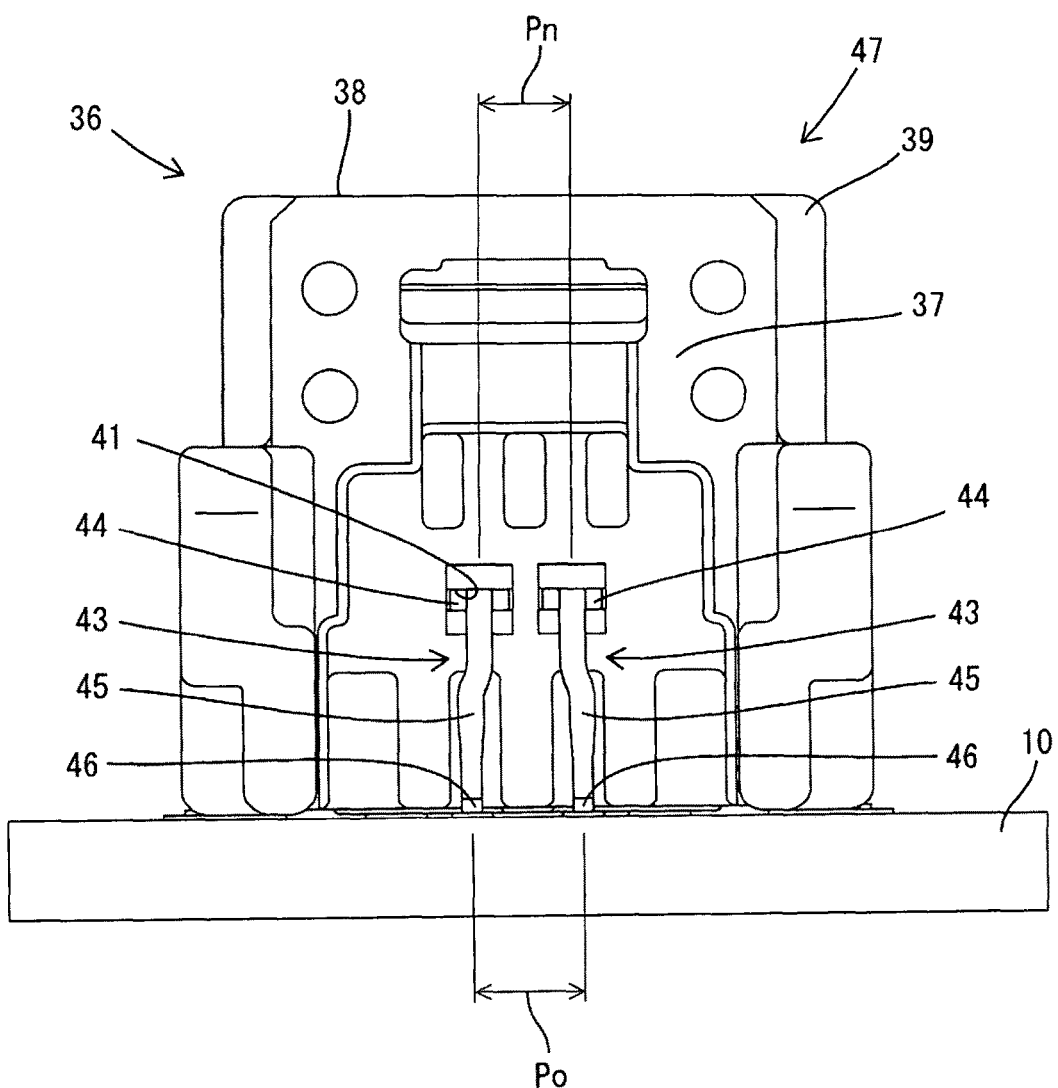
FIG. 11 is a back view showing a state where an unshielded board connector is mounted on the circuit board.
Figure 12:
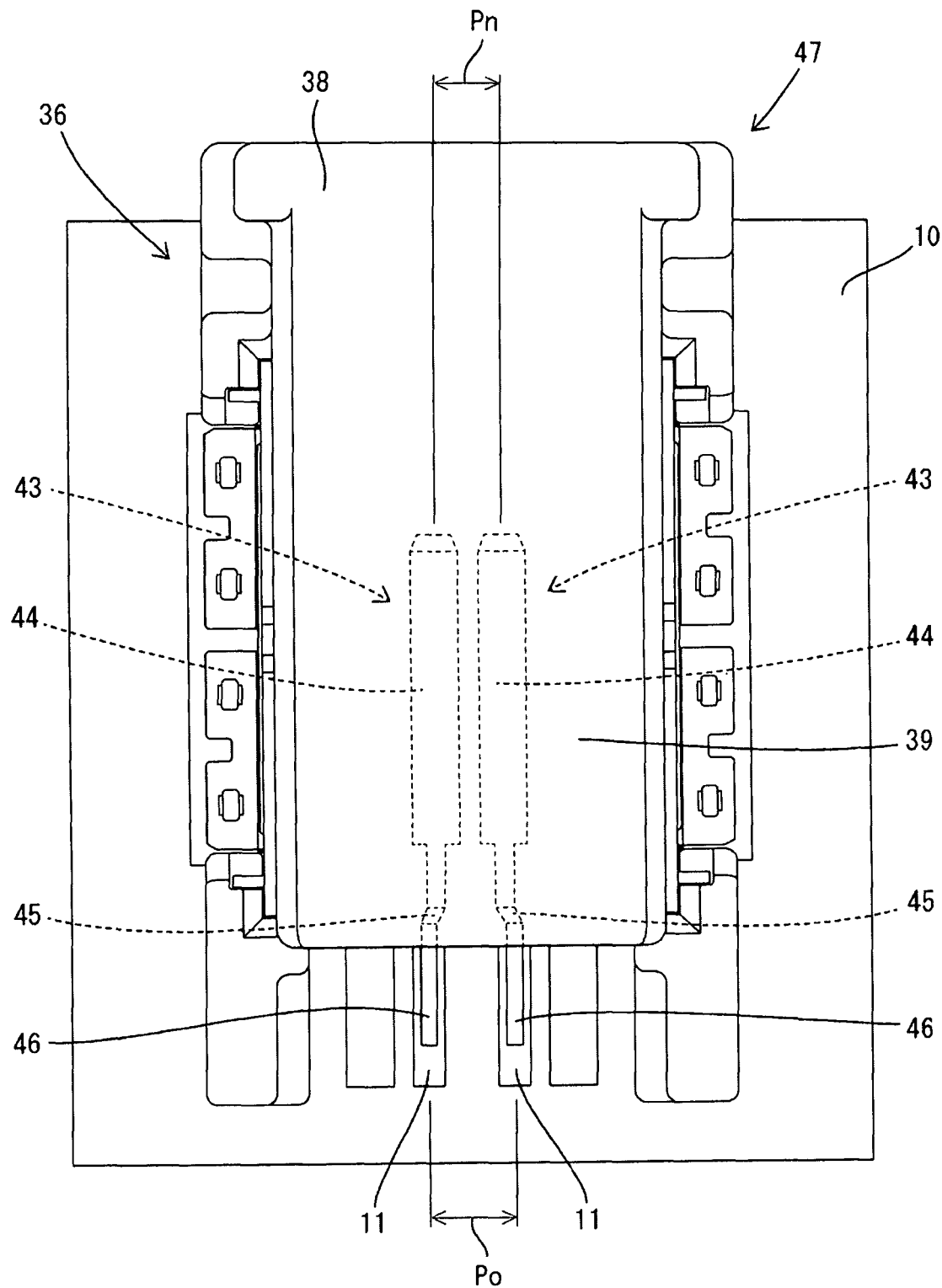
FIG. 12 is a plan view showing the state where the unshielded board connector is mounted on the circuit board.

The two terminal fittings 43 of the unshielded board connector 47 individually are passed through and held in a terminal holding member for unshielding 36 while being press-fit into respective press-fit holes for unshielding 41. As shown in FIGS. 11 and 12, the terminal fittings 43 in the unshielded board connector 47 are also bilaterally symmetrical as in the shielded board connector 42. A tab-like connecting portion 44 extends straight in the front-rear direction (direction parallel to the upper surface of the circuit board 10), and penetrates through the press-fit hole for unshielding 41 of a terminal penetrating portion for unshielding 37 in the front-rear direction. A front area of the tab-like connecting portion 44 projects forward of the terminal penetrating portion for unshielding 37 and is accommodated in a receptacle for unshielding 38. A rear end part of the tab-like connecting portion 44 projects rearward of the terminal penetrating portion for unshielding 37.

A leg 45 extends straight down toward the circuit board 10 substantially at a right angle from the rear end of the tab-like connecting portion 44. A board connecting portion 46 extends straight from the lower end of the leg 45 to be substantially parallel to the upper surface of the circuit board 10. As shown in FIG. 12, in a plan view, two of the board connecting portions 46 are disposed to overlap the two pads 11 and each board connecting portion 46 is disposed at a center position of the pad 11 in the lateral direction. The board connecting portion 46 is conductively fixed to the upper surface of the pad 11 by reflow soldering.

In the unshielded board connector 47, an interval Pn in the lateral direction between the tab-like connecting portions 44 of the two terminal fittings 43 is smaller than an interval Po in the lateral direction between the board connecting portions 46, contrary to the shielded board connector 42. Note that the interval Pn is a distance between centers of the two tab-like connecting portions 44 that are laterally adjacent to each other when the centers of the respective tab-like connecting portions 44 in the width direction (lateral direction parallel to an arrangement direction of the board connecting portions 46) are defined. Thus, in the terminal fitting 43 located on a left side, the tab-like connecting portion 44 and an upper area of the leg 45 are offset right with respect to a lower area of the leg 45 and the board connecting portion 46. In the terminal fitting 43 located on a right side, the tab-like connecting portion 44 and the upper area of the leg 45 are offset leftward with respect to the lower area of the leg 45 and the board connecting portion 46.

The interval Po in the lateral direction between the board connecting portions 46 in the unshielded board connector 47 is equal to the interval Po in the lateral direction between the board connecting portions 46 in the shielded board connector 42. Thus, the interval Pn of the tab-like connecting portions 44 in the unshielded board connector 47 is narrower than the interval Pw of the tab-like connecting portions 44 in the shielded board connector 42. The interval Po of the board connecting portions 46, the interval Pw of the tab-like connecting portions 44 in the shielded board connector 42 and the interval Pn of the tab-like connecting portions 44 in the unshielded board connector 47 satisfy a dimensional relationship of Po=Pw/2+Pn/2.

Due to this dimensional relationship, the two terminal fittings 43 can be used commonly in both the shielded board connector 42 and the unshielded board connector 47 and, simultaneously, a positional relationship of the pads 11 of the circuit board 10 can be common to the shielded board connector 42 and the unshielded board connector 47. In this way, both the shielded board connector 42 and the unshielded board connector 47 can be dealt with only by two types of the terminal fittings 43 and one type of the circuit board 10.

Third Embodiment

A third embodiment of the invention is described with reference to FIGS. 13 to 16. A connection structure of the third embodiment differs from that of the first embodiment in the configuration of bilaterally symmetrical terminal fittings 50 mounted in a shielded board connector 48 and an unshielded board connector 49. The other components are the same as in the first embodiment. These same components are denoted by the same reference signs and the structures, functions and effects thereof are not described.

Figure 13:
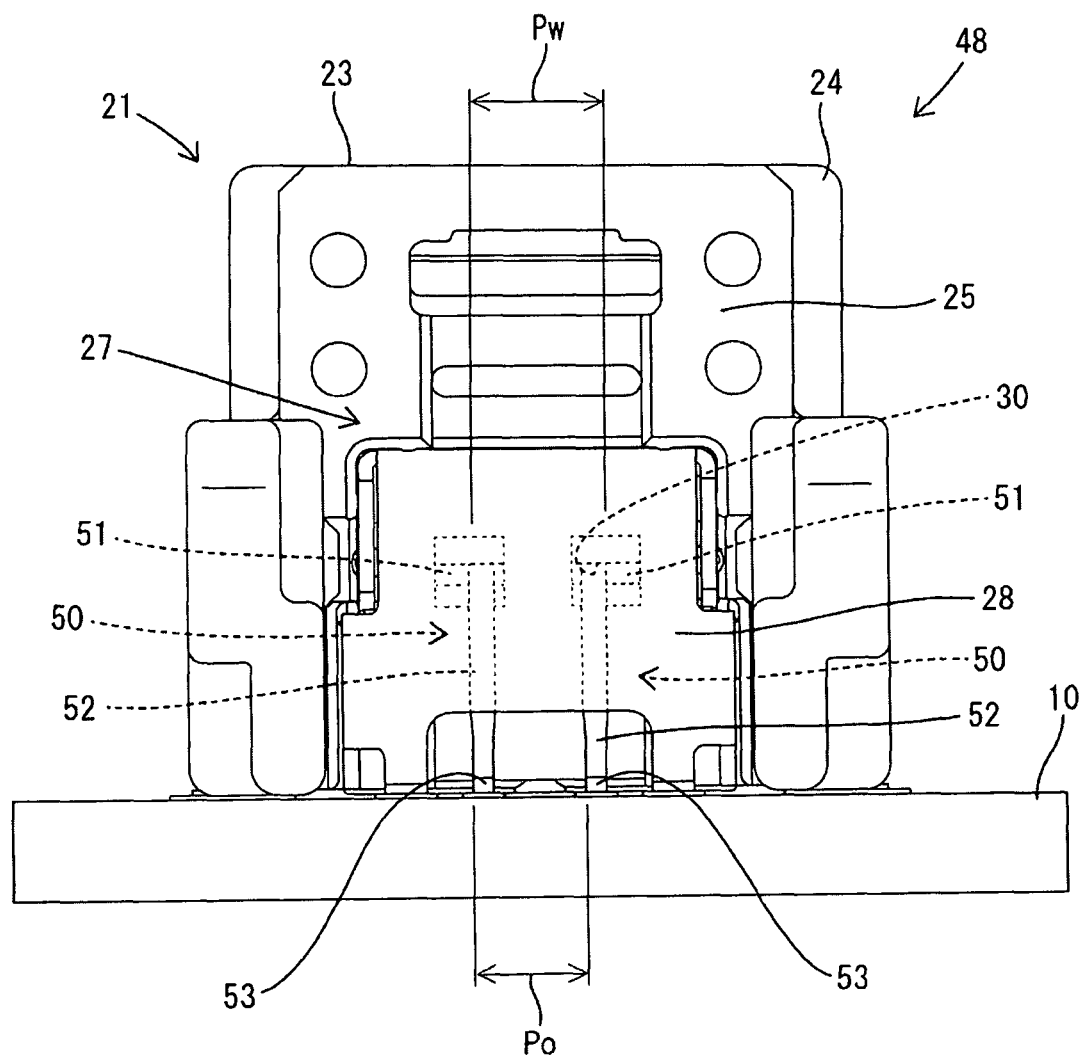
FIG. 13 is a back view showing a state where a shielded board connector is mounted on a circuit board in a third embodiment.
Figure 14:
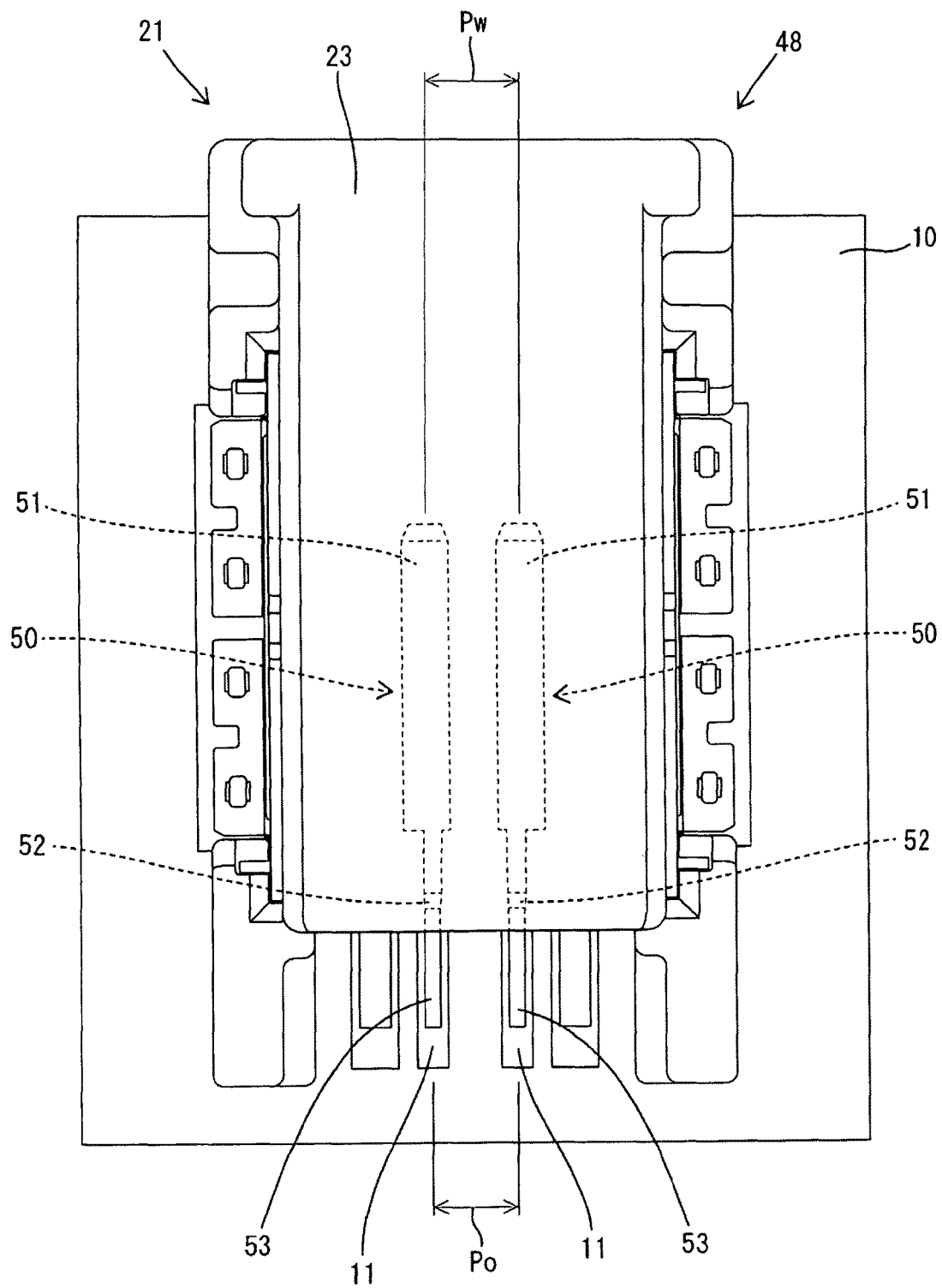
FIG. 14 is a plan view showing the state where the shielded board connector is mounted on the circuit board.

The left and right terminal fittings 50 (terminal fittings for shielding and terminal fittings for unshielding as claimed) of the shielded board connector 48 are held in a terminal holding member for shielding 21 while penetrating through a terminal penetrating wall for shielding 22. As shown in FIGS. 13 and 14, the two terminal fittings 50 are bilaterally symmetrical. Each terminal fitting 50 is formed into a predetermined shape by bending one elongated metal material. The terminal fitting 50 includes a tab-like connecting portion 51 (tab-like connecting portion for shielding and tab-like connecting portion for unshielding as claimed), a leg 52 (leg for shielding and leg for unshielding as claimed) and a board connecting portion 53 (board connecting portion for shielding and board connecting portion for unshielding as claimed).

The tab-like connecting portion 51 extends straight in a front-rear direction (direction parallel to the upper surface of a circuit board 10), and penetrates through a press-fit hole for shielding 30 of the terminal penetrating wall for shielding 22 in the front-rear direction. A front area of the tab-like connecting portion 51 projects forward of the terminal penetrating wall for shielding 22 and is accommodated in a receptacle for shielding 23. A rear end part of the tab-like connecting portion 51 projects rearward of a dielectric (not shown) constituting the terminal penetrating portion for shielding 22 and is covered by a rear part of an outer conductor 28.

The leg 52 extends straight down toward the circuit board 10 substantially at a right angle from the rear end of the tab-like connecting portion 51 and is covered by the rear part of the outer conductor. The board connecting portion 53 extends straight from the lower end of the leg 52 to be substantially parallel to the upper surface of the circuit board 10. The board connecting portion 53 is narrower than a pad 11. As shown in FIG. 14, in a plan view, two of the board connecting portions 53 are disposed to overlap two of the pads 11 and each board connecting portion 53 is at a center position of the pad 11 in the lateral direction. The board connecting portion 53 is fixed conductively to the upper surface of the pad 11 by reflow soldering.

In the pair of terminal fittings 50, an interval Pw in the lateral direction between the tab-like connecting portions 51 is larger than an interval Po in the lateral direction between the board connecting portions 53. Note that the interval Pw is a distance between centers of the two tab-like connecting portions 51 that are laterally adjacent to each other when the centers of the respective tab-like connecting portions 51 in a width direction (lateral direction parallel to an arrangement direction of the both tab-like connecting portions 51) are defined. Further, the interval Po is a distance between centers of the two board connecting portions 53 that are laterally adjacent to each other when the centers of the respective board connecting portions 53 in the width direction (lateral direction parallel to an arrangement direction of the board connecting portions 53) are defined.

As shown in FIGS. 13 and 14, in a plan view and a back view, the leg 52 and the board connecting portion 53 are in such a concentric positional relationship that centers in the width direction (lateral direction) coincide. The tab-like connecting portion 51 is at a position offset either left or right with respect to the leg 52 and the board connecting portion 53. In the terminal fitting 50 located on a left side, the tab-like connecting portion 51 is offset leftward with respect to the leg 52 and the board connecting portion 53. In the terminal fitting 50 located on a right side, the tab-like connecting portion 51 is offset rightward with respect to the leg 52 and the board connecting portion 53.

Figure 15:
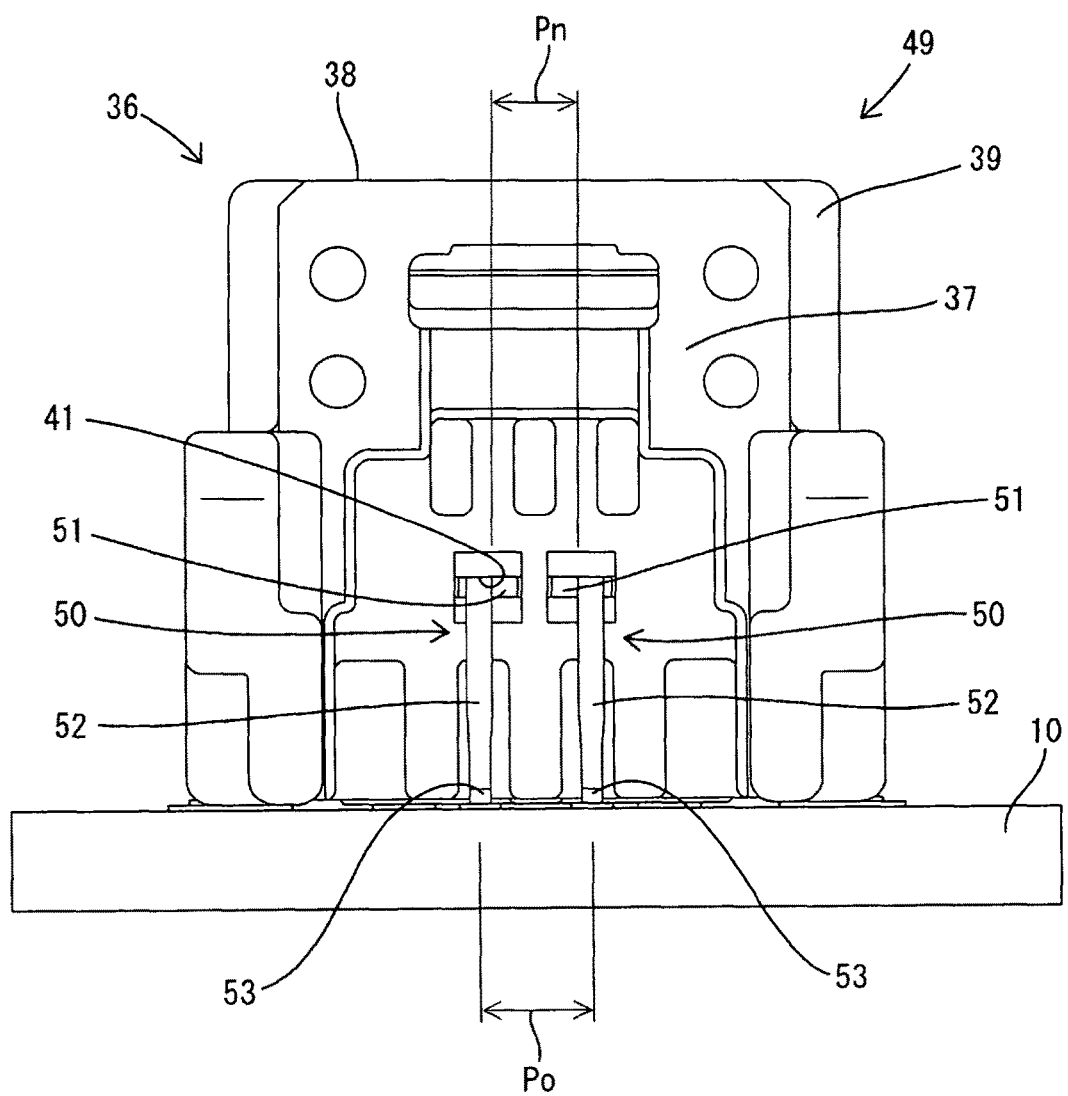
FIG. 15 is a back view showing a state where an unshielded board connector is mounted on the circuit board.
Figure 16:
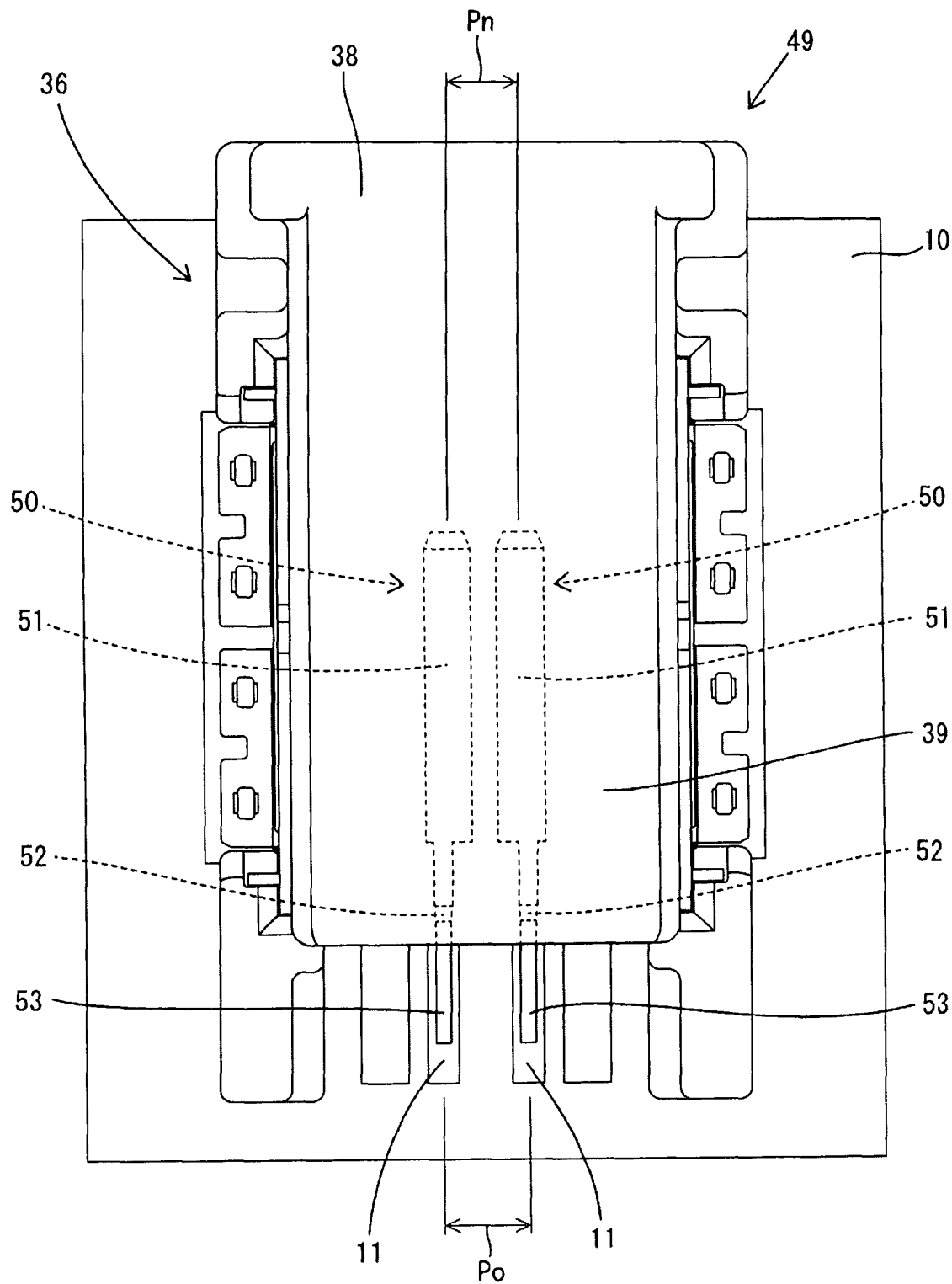
FIG. 16 is a plan view showing the state where the unshielded board connector is mounted on the circuit board.

The terminal fittings 50 of the unshielded board connector 49 are passed individually through and held in a terminal holding member for unshielding 36 while being press-fit into respective press-fit holes for unshielding 41. As shown in FIGS. 15 and 16, the terminal fittings 50 in the unshielded board connector 49 also are bilaterally symmetrical, as in the shielded board connector 48. A tab-like connecting portion 51 extends straight in the front-rear direction (direction parallel to the upper surface of the circuit board 10), and penetrates through the press-fit hole for unshielding 41 of a terminal penetrating portion for unshielding 37 in the front-rear direction. A front area of the tab-like connecting portion 51 projects forward of the terminal penetrating portion for unshielding 37 and is accommodated in a receptacle for unshielding 38. A rear part of the tab-like connecting portion 51 projects rearward of the terminal penetrating portion for unshielding 37.

A leg 52 extends straight down toward the circuit board 10 substantially at a right angle from the rear end of the tab-like connecting portion 51. A board connecting portion 53 extends straight from the lower end of the leg 52 to be substantially parallel to the upper surface of the circuit board 10. As shown in FIG. 16, in a plan view, two of the board connecting portions 53 are disposed to overlap two of the pads 11 and each board connecting portion 53 is disposed at a center position of the pad 11 in the lateral direction. The board connecting portion 53 is fixed conductively to the upper surface of the pad 11 by reflow soldering.

In the unshielded board connector 49, an interval $Pn$ in the lateral direction between the tab-like connecting portions 51 of the terminal fittings 50 is smaller than an interval $Po$ in the lateral direction between the board connecting portions 53, contrary to the shielded board connector 48. Note that the interval $Pn$ is a distance between centers of the two tab-like connecting portions 51 that are laterally adjacent to each other when the centers of the respective tab-like connecting portions 51 in the width direction (lateral direction parallel to an arrangement direction of the pair of board connecting portions 53) are defined. Thus, in the terminal fitting 50 located on a left side, the tab-like connecting portion 51 is offset rightward with respect to the leg 52 and the board connecting portion 53. In the terminal fitting 50 located on a right side, the tab-like connecting portion 51 is offset leftward with respect to the leg 52 and the board connecting portion 53.

The interval $Po$ in the lateral direction between the board connecting portions 53 in the unshielded board connector 49 is equal to the interval $Po$ in the lateral direction between the board connecting portions 53 in the shielded board connector 48. Thus, the interval $Pn$ of the tab-like connecting portions 51 in the unshielded board connector 49 is narrower than the interval $Pw$ of the tab-like connecting portions 51 in the shielded board connector 48. The interval $Po$ of the board connecting portions 53, the interval $Pw$ of the tab-like connecting portions 51 in the shielded board connector 48 and the interval $Pn$ of the tab-like connecting portions 51 in the unshielded board connector 49 satisfy a dimensional relationship of $Po=Pw/2+Pn/2$.

Due to this dimensional relationship, the terminal fittings 50 can be commonly used in both the shielded board connector 48 and the unshielded board connector 49 and, simultaneously, a positional relationship of the pads 11 of the circuit board 10 can be common to the shielded board connector 48 and the unshielded board connector 49. In this way, both the shielded board connector 48 and the unshielded board connector 49 can be dealt with only by two types of the terminal fittings 50 and one type of the circuit board 10.

The invention is not limited to the above described and illustrated embodiments. For example, the following embodiments also are included in the scope of the invention.

Although the terminal fittings for shielding and the terminal fittings for unshielding are used commonly in the first to third embodiments, the terminal fittings for shielding and the terminal fittings for unshielding may be dedicated terminal fittings having different shapes.

Although the terminal fittings for shielding are bilaterally symmetrical in the first to third embodiments, the terminal fittings for shielding may be bilaterally asymmetrical.

Although the two terminal fittings for unshielding are bilaterally symmetrical in the first to third embodiments, the terminal fittings for unshielding may be bilaterally asymmetrical.

LIST OF REFERENCE SIGNS

10 . . . circuit board
11 . . . pad
20, 42, 48 . . . shielded board connector
21 . . . terminal holding member for shielding
31, 43, 50 . . . terminal fitting (terminal fitting for shielding, terminal fitting for unshielding)
32, 44, 51 . . . tab-like connecting portion (tab-like connecting portion for shielding, tab-like connecting portion for unshielding)
33, 45, 52 . . . leg portion (leg portion for shielding, leg portion for unshielding)
34, 46, 53 . . . board connecting portion (board connecting portion for shielding, board connecting portion for unshielding)
35, 47, 49 . . . unshielded board connector
36 . . . terminal holding member for unshielding
Pw . . . interval of tab-like connecting portions in shielded board connector
Pn . . . interval of tab-like connecting portions in unshielded board connector
Po . . . interval of board connectors.

The invention claimed is:

1. A connection structure for circuit board and board connector for assembling a selected one of a shielded board connector and an unshielded board connector, comprising:
a circuit board having left and right conductive pads laterally spaced from one another at an interval Po;
first and second terminal fittings having opposite front and rear ends, a first tab-like connecting portion at the front end of the first terminal fitting and a first board connecting portion at the rear end of the first terminal fitting, a second tab-like connecting portion at the front end of the second terminal fitting and a second board connecting portion at the rear end of the second terminal fitting, the first and second terminal fittings being configured so that:

the first and second tab-like connecting portions are identical, the first and second board connecting portions are identical, the first tab-like connecting portion is offset from the first board connecting portion in a first lateral direction when the first and second tab-like connecting portions are parallel, and the second tab-like connecting portion is offset from the second board connecting portion in a second lateral direction that is opposite to the first lateral direction when the first and second tab-like connecting portions are parallel;

a terminal holding member of the shielding board connector mountable on an upper surface of the circuit board and having left and right terminal press-fit holes for receiving the first and second tab-like connecting portions respectively so that the first and second board connecting portions align respectively with the left and right conductive pads of the circuit board outside the terminal holding member for shielding, with an interval $P_w$, of the first and second tab-like connecting portions being narrower than the interval $P_o$, of the left and right conductive pads; and a terminal holding member of the unshielded board connector mountable on the upper surface of the circuit board and having left and right terminal press-fit holes for receiving the second and first tab-like connecting portions respectively so that the second and first board connecting portions align respectively with the left and right conductive pads of the circuit board outside the terminal holding member for unshielding with an interval $P_n$ of the first and second tab-like connecting portions being wider than the interval $P_o$ of the left and right conductive pads, wherein one of the shielded board connector and the unshielded board connector is assembled with the first and second terminal fittings and the circuit board in accordance with shielding and unshielding requirements.

2. The connection structure for circuit board and board connector according to claim 1, wherein, the interval Pw of the tab-like connecting portions when mounted in the terminal holding member of the shielded board connector, the interval Pn of the tab-like connecting portions when mounted in the terminal holding member of the shielding board connector and the interval Po of the board connecting portions for shielding and the interval of the left and right conductive pads are selected so that Po=Pw/2+Pn/2.

3. The connection structure for circuit board and board connector according to claim 2, wherein:

each of the terminal fittings includes a leg linking a rear end of the tab-like connecting portion and the board connecting portion, and the leg is disposed laterally concentrically with respect to the tab-like connecting portion.

4. The connection structure for circuit board and board connector according to claim 1, wherein:

each of the terminal fittings includes a leg linking a rear end of the tab-like connecting portion and the board connecting portion, and the leg is disposed laterally concentrically with respect to the tab-like connecting portion.

5. The connection structure for circuit board and board connector according to claim 1, wherein:

each of the terminal fittings includes a leg linking a rear end of the tab-like connecting portion and the board connecting portion, and at least a portion of the leg extending diagonally with respect to the tab-like connecting portion and the board connecting portion.

6. The connection structure for circuit board and board connector according to claim 1, further comprising a shield terminal mounted in the terminal holding member of the shielded board connector, the shield terminal surrounding portions of the first and second terminal fittings.

* * * * *